(12) United States Patent  
Tang

(10) Patent No.: US 12,272,641 B2  
(45) Date of Patent: Apr. 8, 2025

(54) SEMICONDUCTOR STRUCTURE, MEMORY AND METHOD FOR OPERATING MEMORY

(71) Applicant: CHANGXIN MEMORY TECHNOLOGIES, INC., Hefei (CN)

(72) Inventor: Yanzhe Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 279 days.

(21) Appl. No.: 17/951,213

(22) Filed: Sep. 23, 2022

(65) Prior Publication Data

US 2023/0035348 A1 Feb. 2, 2023

Related U.S. Application Data

(63) Continuation of application No. PCT/CN2022/109589, filed on Aug. 2, 2022.

(30) Foreign Application Priority Data

Jul. 8, 2022 (CN) .......................... 202210806749.X

(51) Int. Cl.
  *H01L 23/525* (2006.01)
  *G11C 17/16* (2006.01)
  (Continued)

(52) U.S. Cl.
  CPC .......... *H01L 23/5252* (2013.01); *G11C 17/16* (2013.01); *G11C 17/18* (2013.01); *H10B 20/25* (2023.02)

(58) Field of Classification Search
  CPC ........ H10B 20/20; H10B 20/25; G11C 17/16; G11C 17/18; H01L 23/5252
  See application file for complete search history.

(56) References Cited

U.S. PATENT DOCUMENTS 10,964,399 B2  3/2021  Ha
2009/0184350 A1  7/2009  Kodama
(Continued)

FOREIGN PATENT DOCUMENTS

CN  102057441 A  5/2011
CN  102709288 A  10/2012
(Continued)

OTHER PUBLICATIONS

KR office action in application No. 10-2023-7013604, mailed on Jun. 19, 2024.
(Continued)

*Primary Examiner* — Allison Bernstein
(74) *Attorney, Agent, or Firm* — Syncoda LLC; Feng Ma

(57) ABSTRACT

Disclosed are a semiconductor structure, a memory and a method for operating the memory. The semiconductor structure includes: a substrate; a first gate structure and a second gate structure that are located on a surface of the substrate and have a same thickness smaller than a preset thickness; and a first doped area and a second doped area that are located in the substrate and are respectively located on two sides of the first gate structure. The first gate structure forms a selection transistor with the first and second doped areas; an orthographic projection of the second gate structure on the substrate is at least partially overlapped with the second doped area. The second gate structure and the second doped area form an antifuse bit structure. A breakdown state and a non-breakdown state of the antifuse bit structure are configured to represent different stored data.

16 Claims, 9 Drawing Sheets

(51) Int. Cl.
  *G11C 17/18* (2006.01)
  *H10B 20/25* (2023.01)

(56) References Cited

U.S. PATENT DOCUMENTS

| | | |
|---|---|---|
| 2009/0250726 A1 | 10/2009 | Kurjanowicz |
| 2011/0122672 A1 | 5/2011 | Kodama |
| 2011/0267915 A1 | 11/2011 | Son |
| 2012/0211841 A1 | 8/2012 | Kurjanowicz |
| 2015/0062998 A1 | 3/2015 | Nam |
| 2017/0053925 A1* | 2/2017 | Wong .................. H10B 20/25 |
| 2017/0179138 A1* | 6/2017 | Hsu .................. H01L 27/1211 |
| 2018/0204843 A1 | 7/2018 | Son |
| 2021/0358845 A1 | 11/2021 | Liu |

FOREIGN PATENT DOCUMENTS

| | | |
|---|---|---|
| CN | 210245506 U | 4/2020 |
| CN | 111402946 A | 7/2020 |
| CN | 112447732 A | 3/2021 |
| JP | 2012186302 A | 9/2012 |
| KR | 101523138 B1 | 5/2015 |
| KR | 20170083677 A | 7/2017 |
| TW | 201413875 A | 4/2014 |
| TW | I560717 B | 12/2016 |
| TW | I644416 B | 12/2018 |

OTHER PUBLICATIONS

First Office Action of the Taiwanese application No. 112101565, issued on Jan. 26, 2024. 11 pages with English abstract.
Extended European Search Report in application No. 22792731.6, mailed on May 7, 2024.

* cited by examiner

According to data to be written in, a target antifuse bit structure among antifuse bit structures of the memory is broken down, and a non-target antifuse bit structure is kept in a non-breakdown state — S10

FIG. 9

SEMICONDUCTOR STRUCTURE, MEMORY AND METHOD FOR OPERATING MEMORY

CROSS-REFERENCE TO RELATED APPLICATIONS

This application is a continuation of International Application No. PCT/CN2022/109589, filed on Aug. 2, 2022, which is based on and claims priority to Chinese patent application No. 202210806749. X, filed on Jul. 8, 2022 and entitled "SEMICONDUCTOR STRUCTURE, MEMORY AND METHOD FOR OPERATING MEMORY". The disclosures of International Application No. PCT/CN2022/109589 and Chinese patent application No. 202210806749. X are hereby incorporated by reference in their entireties.

BACKGROUND

With the continuous development of science and technology at present, semiconductor memory devices are more and more powerful in performance, and are smaller and smaller in critical dimension. Among them, a One Time Programmable (OTP) Memory is a Non-Volatile Memory (NVM) that can still hold stored data when power is lost. The OTP memory can only carry out one-time burning programming, cannot be electrically erased, can be applied to a program code memory, a serial configuration memory and a System-on-Chip (SOC), and plays a role in ID identification, storage repair and the like.

At present, the OTP memory mainly adopts a structure similar to a Dynamic Random Access Memory (DRAM), which includes a selection transistor and a breakable Transistor Capacitor (1T1C). Since the breakdown of a dielectric layer in the capacitor is irreversible, solidified stored data can be obtained by reading the breakdown state of the capacitor. However, the OTP memory has problems that memory cells occupy a large area, has a low integration degree, a complex manufacturing process, a high manufacturing cost, and the like.

SUMMARY

The disclosure relates to the technical field of semiconductors, and in particular to but not limited to a semiconductor structure, a memory and a method for operating the memory.

In a first aspect, the embodiments of the disclosure provide a semiconductor structure, including: a substrate; a first gate structure and a second gate structure that are located on a surface of the substrate and have a same thickness smaller than a preset thickness; and a first doped area and a second doped area that are located in the substrate and are located on two sides of the first gate structure respectively, wherein the first gate structure forms a selection transistor with the first doped area and the second doped area. An orthographic projection of the second gate structure on the substrate is at least partially overlapped with the second doped area; the second gate structure and the second doped area form an antifuse bit structure; and a breakdown state and a non-breakdown state of the antifuse bit structure are configured to represent different stored data respectively.

In a second aspect, the embodiments of the disclosure provide a method for operating a memory, and the memory includes the semiconductor structure of any above embodiment. The method includes: according to data to be written in, carrying out write-in operation on the memory, wherein the write-in operation includes: breaking down a target antifuse bit structure among antifuse bit structures of the memory, to switch the target antifuse bit structure into a breakdown state from a non-breakdown state; and keeping a non-target antifuse bit structure in the non-breakdown state, wherein the non-target antifuse bit structure is an antifuse bit structure other than the target antifuse bit structure.

In a third aspect, the embodiments of the disclosure provide a memory, including: a memory array including the semiconductor structure of any above embodiment; and a peripheral circuit coupled to the memory array.

BRIEF DESCRIPTION OF THE DRAWINGS

FIG. 9 is illustrates a flowchart of a method for operating a memory according to embodiments of the disclosure.

DETAILED DESCRIPTION

Figure 1:
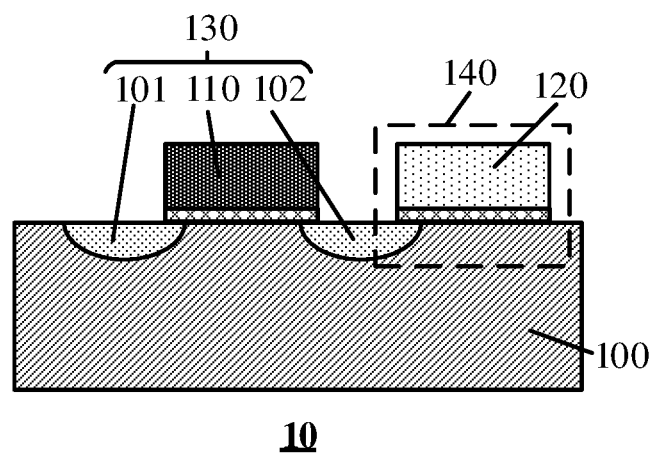
FIG. 1 illustrates a schematic structural diagram of a semiconductor structure according to embodiments of the disclosure.

In order to facilitate an understanding of the disclosure, a more complete description of exemplary implementations of the disclosure will be made below with reference to the associated drawings. Although the exemplary implementations of the disclosure are shown in the drawings, it should be understood that the disclosure may be implemented in various forms and should not be limited to the detailed description set forth herein. Rather, the detailed description is provided so that the disclosure can be more thoroughly understood, and can fully convey the scope of the disclosure to those skilled in the art.

In the following description, numerous specific details are given to provide a thorough understanding of the disclosure. However, it is apparent to those skilled in the art that the disclosure may be practiced without one or more of these details. In some embodiments, some technical features that are well known in the art have not been described in order to avoid obscuring the present disclosure, i.e., all features of an actual embodiment may not be described, and well-known functions and structures are not described in detail.

In general, terms may be understood at least in part from usage in context. For example, depending at least in part on context, the term "one or more" as used herein may be used to describe any feature, structure or characteristic in a singular sense or may be used to describe combinations of features, structures or characteristics in a plural sense. Similarly, term such as "a/an," or "the" may also be construed to convey a singular usage or to convey a plural usage, depending at least in part on the context. In addition, the term "based on" may be understood as not necessarily intended to convey an exclusive set of factors, and may instead allow for additional factors not necessarily expressly described, again depending at least in part on context.

Unless otherwise defined, the terms used herein are for the purpose of describing specific embodiments only and are not intended to be limiting of the disclosure. As used herein, the singular forms "a", "an" and "the" may include the plural forms as well, unless the context clearly indicates otherwise. It also should be understood that the terms "comprise" and/or "include," when used in the specification, specify the presence of features, integers, steps, operations, elements, and/or components, but do not preclude the presence or addition of one or more other features, integers, steps, operations, elements, components, and/or groups. Meanwhile, the term "and/or" includes any and all combinations of associated listed items.

In order that the disclosure is thoroughly understood, detailed steps as well as detailed structures will be set forth in the following description in order to explain the technical solutions of the disclosure. Preferred embodiments of the disclosure are described in detail below, however the disclosure may have other implementations besides these detailed described.

As illustrated in FIG. 1, the embodiments of the disclosure provide a semiconductor structure 10, including: a substrate 100; a first gate structure 110 and a second gate structure 120 that are located on a surface of the substrate 100 and have a same thickness smaller than a preset thickness; and a first doped area 101 and a second doped area 102 that are located in the substrate and are located on two sides of the first gate structure 110 respectively. The first gate structure 110 forms a selection transistor 130 with the first doped area 101 and the second doped area 102. An orthographic projection of the second gate structure 120 on the substrate 100 is at least partially overlapped with the second doped area 102. The second gate structure 120 and the second doped area 102 form an antifuse bit structure 140. A breakdown state and a non-breakdown state of the antifuse bit structure 140 are configured to represent different stored data respectively.

It is noted that in order to allow each structure to be clearly shown in the drawings, the scale of the dimensions of structures may not conform to the actual structures.

In the embodiments of the disclosure, the semiconductor structure 10 may be applied to a one time programmable (OTP) memory. The material of the substrate 100 may include an elemental semiconductor material such as silicon (Si), germanium (Ge), or like, or a compound semiconductor material such as gallium nitride (GaN), gallium arsenide (GaAs), indium phosphide (InP), or like. In some embodiments, there may also be well areas in the substrate 100, such as a P well and a deep N well below the P well, where the P well may be configured for forming a channel of the selection transistor 130, and the deep N well may be configured for isolating the P well to reduce noise interference suffered by devices formed in the P well.

The semiconductor structure 100 may further include multiple first doped areas 101 and multiple second doped areas 102 to serve as source electrodes and drain electrodes of selection transistors 130. The first doped areas 101 and second doped area 102 are located in the substrate 100. The first doped areas 101 may be of a same doping type as the second doped area 102. Impurity ions doped in the P-type doped area can be trivalent elements such as boron, and impurity ions doped in the N-type doped area can be pentavalent elements such as phosphorus, or arsenic. In some embodiments, the first doped areas 101 and the second doped areas 102 may be high-concentration N-type doped areas in the P well, namely N+ type doped areas.

As illustrated in FIG. 1, a first gate structure 110 and a second gate structure 120 are provided on a surface of a substrate 100. The first gate structure 110 and the second gate structure 120 are located in same plane and may have a same thickness. The first doped area 101 and the second doped area 102 are located at two sides of the first gate structure 110 respectively, and the first doped area 101 forms a selection transistor 130 with the second doped area 102 and the first gate structure 110. In addition, an orthographic projection of the second gate structure 120 on the substrate 100 is at least partially overlapped with the second doped area 102, and the second gate structure 120 and the second doped area 102 form an antifuse bit structure 140. The antifuse bit structure 140 may be a structure similar to a Metal Oxide Semiconductor Field Effect Transistor (MOSFET). A breakdown state and a non-breakdown state of a gate dielectric layer of the antifuse bit structure 140 are configured to represent different stored data, namely, "0" or "1". Exemplarily, the first gate structure 110 may include a first gate electrode and a first gate dielectric layer, and the first gate electrode is located above the first gate dielectric layer and can be connected to a Word Line (WL) through a contact structure. The second gate structure 120 may include a second gate electrode and a second gate dielectric layer. The second gate electrode is located on the second gate dielectric layer. The breakdown and non-breakdown states of the second gate dielectric layer are configured for representing different stored data. The first gate electrode and the second gate electrode include, but are not limited to, conductive materials such as metals, or doped semiconductors; and the first gate dielectric layer and the second gate dielectric layer may be silicon oxide, hafnium oxide or other materials.

In some embodiments, a selection transistor 130 and an antifuse bit structure 140 form a memory cell of the OTP memory. By applying different voltages to the first gate electrode, switching on and cutting off of the selection transistor 130 can be controlled. In some embodiments, the first doped area 101 in the selection transistor 130 is further connected to a first metal line, which may be a Bit Line (BL). When the selection transistor 130 is switched on, a voltage on the first metal line may be applied to the second doped area 102; at this time, by applying a suitable voltage to the second gate electrode, a voltage difference between the second gate electrode and the second doped area 102 can be enabled to be greater than or equal to the breakdown voltage of the second gate dielectric layer, so that the antifuse bit structure 140 is permanently broken down, and the one time programming operation of the memory cell is completed.

In some embodiments, the first gate dielectric layer in the first gate structure 110 is a thick gate oxide structure, which can be up to 6 nm in thickness. The thick gate oxide structure can enable the selection transistor 130 to withstand a higher gate voltage, thus reducing the possibility of false breakdown of the selection transistor 130. However, in order to enable the selection transistor 130 of the thick gate oxide structure to have a sufficient read current, the selection transistor 130 should have a large diffusion width, namely a large channel width. Here, the channel width refers to the width of the channel in the direction connecting the source electrode and drain electrode. Thus, the selection transistor 130 occupies a larger area, resulting in a lower integration degree of the OTP memory. In addition, the antifuse bit structure 140 adopts the thin gate oxide structure as the second gate dielectric layer, so that there is a large thickness difference between the second gate dielectric layer and the first gate dielectric layer. In the manufacturing process, a relatively large distance is required between the first gate structure 110 and the second gate structure 120 to meet the requirements of a photoetching process for different gate oxide layer thicknesses, which also results in that the semiconductor structure 10 occupies a larger area.

In the embodiments of the disclosure, the first gate dielectric layer and the second gate dielectric layer can be of a thin gate oxide structure and have the same thickness, namely, the first gate structure 110 and the second gate structure 120 may have the same thickness smaller than a preset thickness. Exemplarily, the thickness of the thin gate oxide structure herein may be smaller than 3 nm. Thus, the thin gate oxide structure can enable the selection transistor 130 to have a reduced channel width on the premise of having enough read current, so that the selection transistor 130 occupies a smaller area, and the integration degree of the memory is improved. The first gate dielectric layer and the second gate dielectric layer have the same thickness and can be synchronously formed in the manufacturing process, so that the manufacturing process is simplified, and meanwhile, the distance between the first gate structure 110 and the second gate structure 120 is shortened. Moreover, an orthographic projection of the second gate structure 120 on the substrate 100 is at least partially overlapped with the second doped area 102, so that there is no need to additionally form a doped area beside the second doped area 102 as a lower electrode corresponding to the second gate electrode; thus the manufacturing process is simplified, and the occupied area of the semiconductor structure 10 is further reduced. In some embodiments, the voltages applied to the first doped area 101 and the first gate electrode can be adjusted such that the voltage difference therebetween is smaller than the breakdown voltage of the thin gate oxide structure, so as to reduce the possibility of false breakdown of the selection transistor 130.

Figure 2:
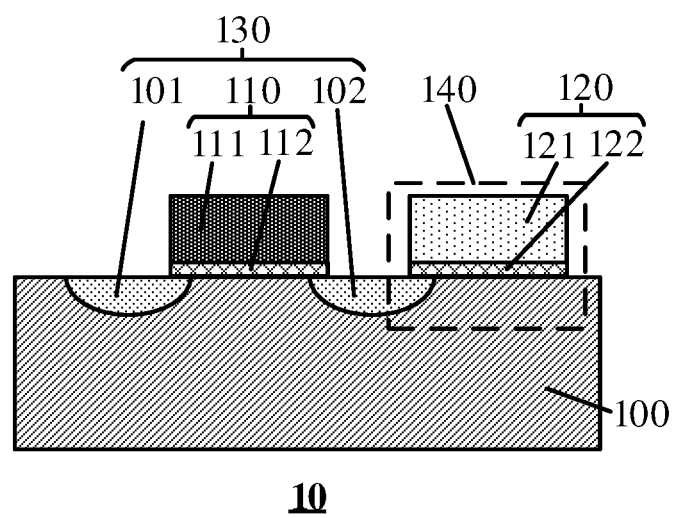
FIG. 2 illustrates a schematic structural diagram of another semiconductor structure according to embodiments of the disclosure.

In some embodiments, as illustrated in FIG. 2, the first gate structure 110 includes a first gate electrode 111 and a first gate dielectric layer 112 located below the first gate electrode 111; and the second gate structure 120 includes a second gate electrode 121 and a second gate dielectric layer 122 located below the second gate electrode 121. The first gate dielectric layer 112 and the second gate dielectric layer 122 have a same thickness, and are of a predetermined thin gate oxide structure.

In the embodiments of the disclosure, the first gate structure 110 may include a first gate electrode 111 and a first gate dielectric layer 112, and the first gate dielectric layer 112 may be at least located between the first gate electrode 111 and the substrate 100. The second gate structure 120 may include a second gate electrode 121 and a second gate dielectric layer 122, and the second gate dielectric layer 122 may be located at least between the second gate electrode 121 and the second doped area 102. Exemplarily, the first gate electrode 111 and the second gate electrode 121 include, but are not limited to, a conductive material such as tungsten (W), or doped polysilicon. The first gate dielectric layer 112 and the second gate dielectric layer 122 can be silicon oxide, hafnium oxide or other materials. The first gate dielectric layer 112 and the second gate dielectric layer 122 have the same thickness and are of a predetermined thin gate oxide structure. Herein, the predetermined thin gate oxide structure may be a gate oxide layer having a thickness smaller than 3 nm, and the thickness herein refers to a thickness in a direction perpendicular to the surface of the substrate 100. The first gate dielectric layer 112 of the thin gate oxide structure can enable the channel width of the selection transistor 130 to be smaller, so that the selection transistor 130 occupies less area. In addition, the first gate dielectric layer 112 and the second gate dielectric layer 122 with the same thickness can be synchronously formed, so that the manufacturing process is simplified. In this way, when the voltage difference between the second gate electrode 121 and the second doped area 102 is greater than or equal to the breakdown voltage of the second gate dielectric layer 122, the second gate dielectric layer 122 is broken down, namely, the antifuse bit structure 140 is permanently broken down, thereby completing the one time programming operation of the memory cell.

In some embodiments, the first gate dielectric layer 112 and the second gate dielectric layer 122 may be a same continuous layer of thin gate oxide structure. A portion of the thin gate oxide structure located between first gate electrode 111 and the substrate 100 is the first gate dielectric layer 112, and a portion of the thin gate oxide structure located between the second gate electrode 121 and the second doped area 102 is the second gate dielectric layer 122.

In some embodiments, as illustrated in FIGS. 3-6, the first gate structure 110 may further be connected to a WL 113 through a contact structure, and the second gate structure 120 may be connected to a third metal line 123 through a contact structure. An extension direction of the WL 113 may be parallel to an extension direction of the third metal line 123.

Figure 3:
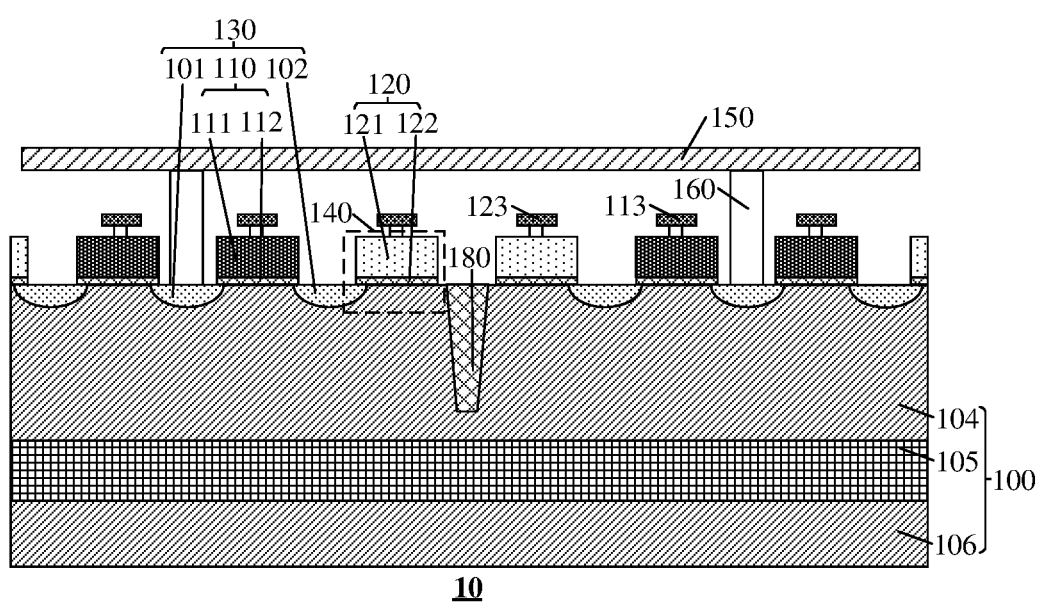
FIG. 3 illustrates a schematic structural diagram of still another semiconductor structure according to embodiments of the disclosure.

In some embodiments, as illustrated in FIG. 3, the semiconductor structure 10 further includes a first metal line 150. The first metal line 150 is located above the first gate structure 110 and the second gate structure 120, and is connected with the first doped area 101 through a first connection structure 160.

In embodiments of the disclosure, the first metal line 150 may be a BL of the memory. When the selection transistor 130 is switched on, a voltage on the first metal line 150 can be applied to the second doped area 102 of the antifuse bit structure 140 through the selection transistor 130; at this time, by applying a suitable voltage to the second gate electrode 121, a voltage difference between the second doped area 102 and the second gate electrode 121 can be enabled to be greater than or equal to the breakdown voltage of the second gate dielectric layer 122. Thus, the antifuse bit structure 140 is permanently broken down, and the one time programming operation of the memory cell is completed. The extension direction of the first metal line 150 can be perpendicular to the extension direction of the WL 113 in the memory, so that a memory cell can be provided at the intersection of the extension directions of the BL and the WL 113 to form a memory cell array. In other embodiments, the extension direction of the first metal line 150 intersects, but is not perpendicular to, the extension direction of the WL 113. The first metal line 150 is connected to the first doped area 101 through first connection structure 160, which may be a conductive material such as a metal, a doped semiconductor, or the like.

In some embodiments, as illustrated in FIG. 3, the substrate 100 includes a first well 104 and a second well 105 of opposite doping types. The second well 105 is located below the first well 104. The first doped area 101 and the second doped area 102 are located in the first well 104, and the doping type of the first doped area 101 and the second doped area 102 is the same as that of the second well 105.

In the embodiments of the disclosure, the substrate 100 further includes a second well 105 and a first well 104 located above the second well 105. The first well 104 is configured to form a channel of the selection transistor 130. The doping types of the first well 104 and the second well 105 are opposite to each other, so that the second well 105 has the same doping type as the first doped area 101 and the second doped area 102, and the second well 105 can effectively isolate the first well 104. In some embodiments, the substrate 100 may further include a base 106 located below the second well 105, and the doping type of the base 106 may be the same as that of the first well 104 here. Exemplarily, the first well 104 is a P well, the second well 105 is a deep N well, the base 106 is a P-type doped semiconductor material, and the first doped area 101 and the second doped area 102 are N-type doped areas; in this way, reverse-biased PN junctions are formed between the first well 104 and the second well 105 and between the second well 105 and the base 106, thereby reducing noise interference suffered by a device formed in the first well 104. In some embodiments, the second well 105 may surround the bottom face and side faces of the first well 104 to improve the isolation effect.

Figure 4:
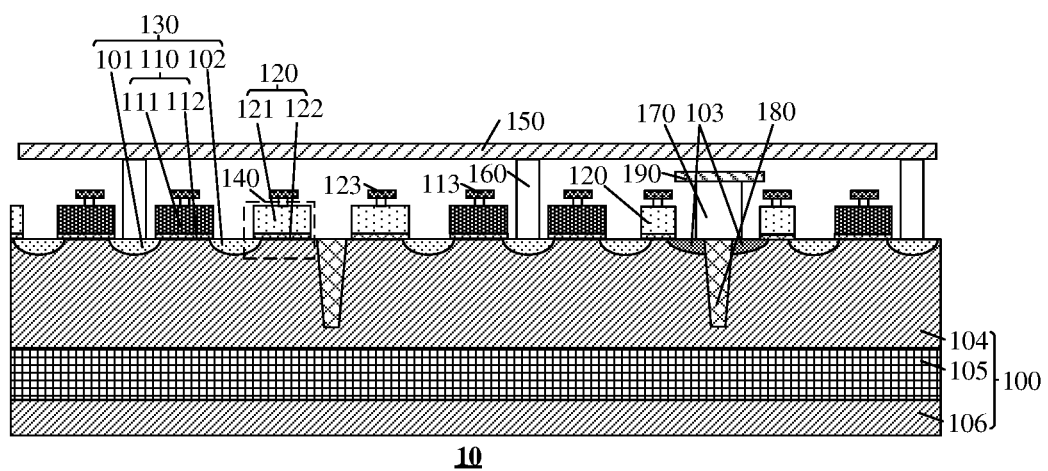
FIG. 4 illustrates a schematic structural diagram of yet another semiconductor structure according to embodiments of the disclosure.

In some embodiments, as illustrated in FIG. 4, the semiconductor structure 10 further includes a second metal line 190.

The second metal line 190 is located between the first gate structure 110 and the first metal line 150, and is connected with the substrate 100 through a second connection structure 170.

In the embodiments of the disclosure, the second metal line 190 may apply a voltage to the substrate 100 through the second connection structure 170. The second metal line 190 is located above the first gate structure 110 and below the first metal line 150, thereby reducing problems such as short circuit between the second metal line 190 and the first gate structure 110 and between the second metal line 190 and the first metal line 150. The second connection structure 170 may be a conductive material such as a metal, or a doped semiconductor. The second metal line 190 is configured to apply a voltage to the substrate 100, so as to ensure that the PN junctions formed between the first doped area 101 and the second doped area 102 in each selection transistor 130 and the substrate 100 are not reversely broken down, such as avalanche breakdown of source and drain electrodes in a metal oxide semiconductor (MOS) transistor. In some embodiments, in the memory cell array of the OTP memory, the second metal line 190 may be in a matrix layout and is connected to the substrate of multiple selection transistors 130 through multiple second connection structures 170 respectively, thereby simultaneously applying voltage to the substrate of multiple memory cells, and ensuring that the PN junctions in the multiple selection transistors 130 are not reversely broken down.

In some embodiments, as illustrated in FIG. 4, the semiconductor structure 10 further includes an isolating structure 180.

The isolating structure 180 is located in the substrate 100 between two adjacent antifuse bit structures 140. At least a portion of the second connection structure 170 is located above the isolating structure 180.

In the embodiments of the disclosure, the antifuse bit structures 140 of two memory cells that are adjacent to each other and do not share the same first doped area 101 are close to each other. Therefore, the isolating structure 180 provided between two adjacent antifuse bit structures 140 can prevent problems such as electric leakage between active areas of two memory cells that are adjacent to each other and do not share the first doped area 101. The depth of the isolating structure 180 is greater than those of the first doped area 101 and the second doped area 102. Exemplarily, the isolating structure 180 may be formed through Shallow Trench Isolation (STI), which has the advantages of low cost, good isolation effect, and the like, and the material of the isolating structure 180 includes, but is not limited to, silicon oxide, and the like. At least portion of the second connection structure 170 is located above the isolating structure 180, and the bottom width of the second connection structure 170 can be greater than the top width of the isolating structure 180, so that the bottom of the second connection structure 170 can be in contact with the substrate 100, and the second connection structure 170 is electrically connected with the substrate 100.

In some embodiments, as illustrated in FIG. 4, the semiconductor structure 10 further includes a third doped area 103.

The third doped area 103 is located in the substrate on two sides of the isolating structure 180. The second connection structure 170 is connected with the substrate 100 through the third doped area 103.

In embodiments of the disclosure, the substrate 100 on two sides of the isolating structure 180 is further provided with a third doped area 103, and the second connection structure 170 is connected with the substrate 100 through the third doped area 103, so as to apply voltage to the substrate 100. The doping type of the third doped area 103 may be opposite to those of the first doped area 101 and second doped area 102, and the third doped area 103 is used for reducing contact resistance between the second connection structure 170 and the substrate 100. Exemplarily, the third doped area 103 may be a P+ type doped area.

Figure 5:
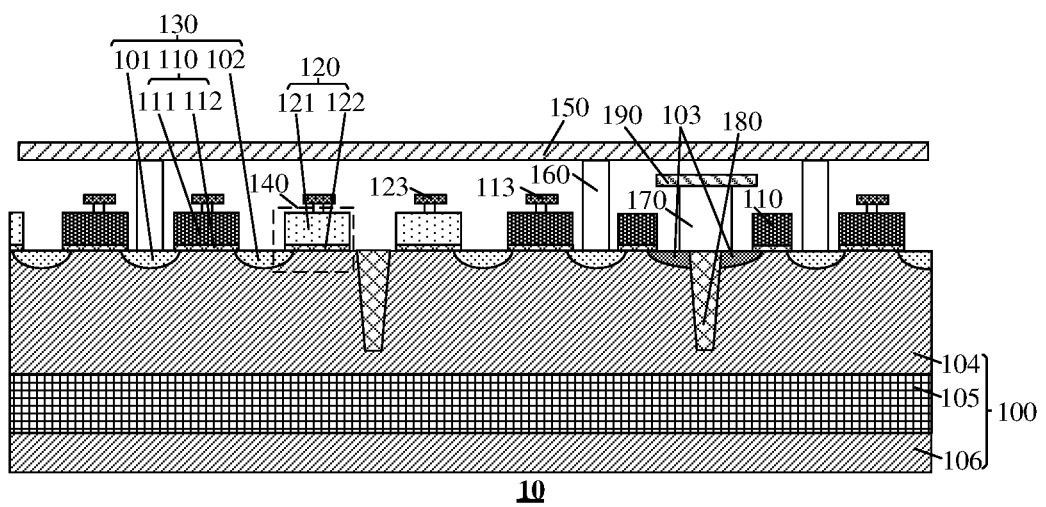
FIG. 5 illustrates a schematic structural diagram of yet another semiconductor structure according to embodiments of the disclosure.

It can be understood that the distance between the second connection structure 170 and the first connection structure 160 in FIG. 4 is large, that is, a first gate structure 110 and a second gate structure 120 are disposed between the second connection structure 170 and the first connection structure 160, so that signal interference produced during operation of the memory can be effectively reduced. In addition, the second gate structures 120 on two sides of the second connection structure 170 can play a self-alignment role in forming the third doped area 103, and the second gate structures 120 here may still be part of the memory cell to store data. In some embodiments, as illustrated in FIG. 5, the second connection structure 170 may be disposed closer to the first connection structure 160, i.e., only a first gate structure 110 is disposed between the second connection structure 170 and the first connection structure 160, thereby saving the occupied area of the semiconductor structure 10. However, the first gate structure 110 independently disposed here can form no memory cell, and only plays a self-alignment role when forming the third doped area 103. In the case illustrated in FIG. 5, the second connection structure 170 and the first connection structure 160 may be staggered from each other by a certain distance in the extension direction of the WL, so as to reduce signal interference.

Figure 6:
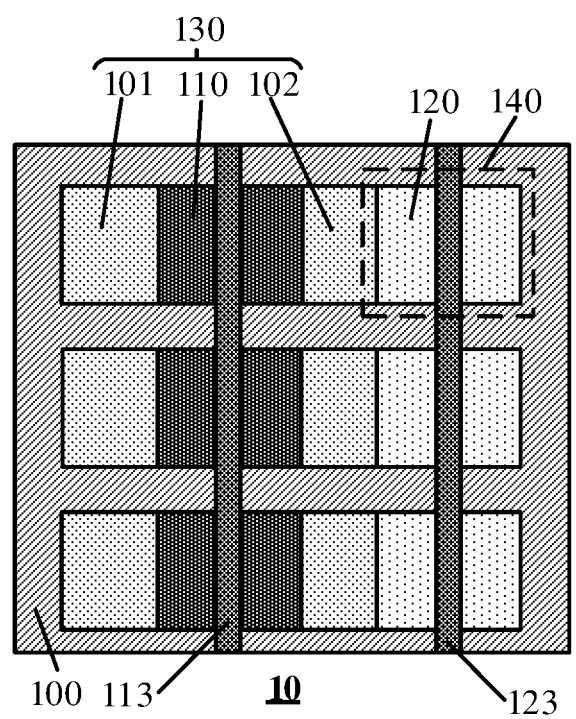
FIG. 6 illustrates a top view of a semiconductor structure according to embodiments of the disclosure.

In some embodiments, FIG. 6 illustrates a local top view of the semiconductor structure 10. The semiconductor structure further includes: a word line 113 located above the first gate structure 110 and connected with multiple first gate structures 110 located in an extension direction of the WL; a third metal line 123 located above the second gate structure 120. An extension direction of the third metal line 123 is parallel to an extension direction of the WL 113, and the third metal line 123 is connected with multiple second gate structures 120 located in the extension direction of the third metal line 123.

In the embodiments of the disclosure, a selection transistor 130 and an antifuse bit structure 140 form a memory cell of the OTP memory. The first gate structure 110 may be connected, through a contact structure, to the WL 113 located above the first gate structure 110. The WL 113 is connected with the first gate structures 110 of multiple memory cells located in the extension direction of the WL. The second gate structure 120 may be connected, through a contact structure, to the third metal line 123 located above the second gate structure 120. The third metal line 123 is connected with the second gate structures 120 of multiple memory cells located in the extension direction of the third metal line. An extension direction of the WL 113 is parallel to that of the third metal line 123. In this way, one WL 113 can control the switching on or cutting off of the selection transistors 130 of the multiple memory cells in the extension direction of the WL, and one third metal line 123 can simultaneously supply voltage to the second gate structures 120 of the multiple memory cells in the extension direction thereof, thereby simplifying the operation of the memory. Exemplarily, the WL 113 and the third metal line 123 may be located in the same plane parallel to the surface of the substrate 100, and the WL 113 and the third metal line 123 may be formed synchronously to simplify the manufacturing process.

In some embodiments, as illustrated in FIGS. 3-5, two adjacent selection transistors 130 are symmetrically disposed and share a same first doped area 101.

In embodiments of the disclosure, any two adjacent selection transistors 130 are symmetrically disposed and share the same first doped area 101. Thus, in the OTP memory, any two adjacent memory cells are symmetrically disposed and share one same first doped area 101, so that the occupied area of each memory cell is reduced. In addition, one BL (the first metal line 150) can be connected to two adjacent memory cells through one first connection structure 160, so as to apply voltage to the first doped areas 101 of the two memory cells at the same time, thus improving the working efficiency of the memory.

Figure 7:
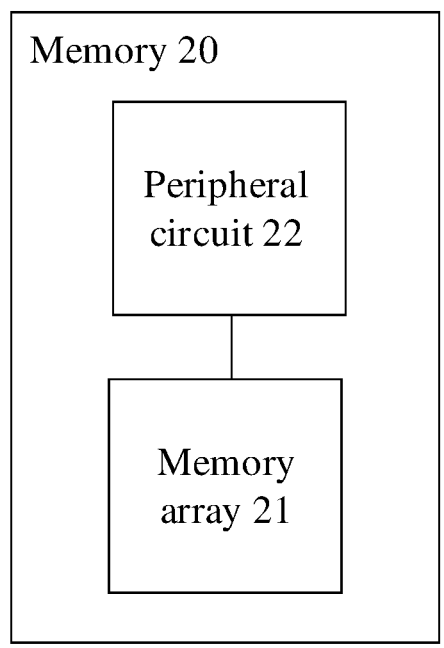
FIG. 7 illustrates a schematic structural diagram of a memory according to embodiments of the disclosure.

As illustrated in FIG. 7, the embodiments of the disclosure further provide a memory 20, including: a memory array 21 including the semiconductor structure of any one above embodiment; and a peripheral circuit 22 coupled to the memory array 21.

In the embodiments of the disclosure, the memory 20 includes a memory array 21 and a peripheral circuit 22 coupled to the memory array 21. The memory array 21 includes the semiconductor structure 10 of any above embodiment. The peripheral circuit 22 includes an address circuit for latching and decoding row/column address information, a sensing circuit for monitoring and judging information stored by the antifuse unit, and a control circuit for switching operation modes. Therefore, on one hand, the first gate structure and the second gate structure can have thin gate oxide structures with the same thickness, so that the channel width of the selection transistor is smaller, reducing the occupied area of the antifuse structure, and meanwhile, the thin gate oxide structures of the first gate structure and the second gate structure can be synchronously formed, so that the manufacturing process is simplified. On the other hand, the length of the antifuse bit structure in the horizontal direction is reduced by the overlapped part of the second gate structure and the second doped area, which also reduces the area of the antifuse bit structure and improves the integration degree of the memory.

Figure 8:
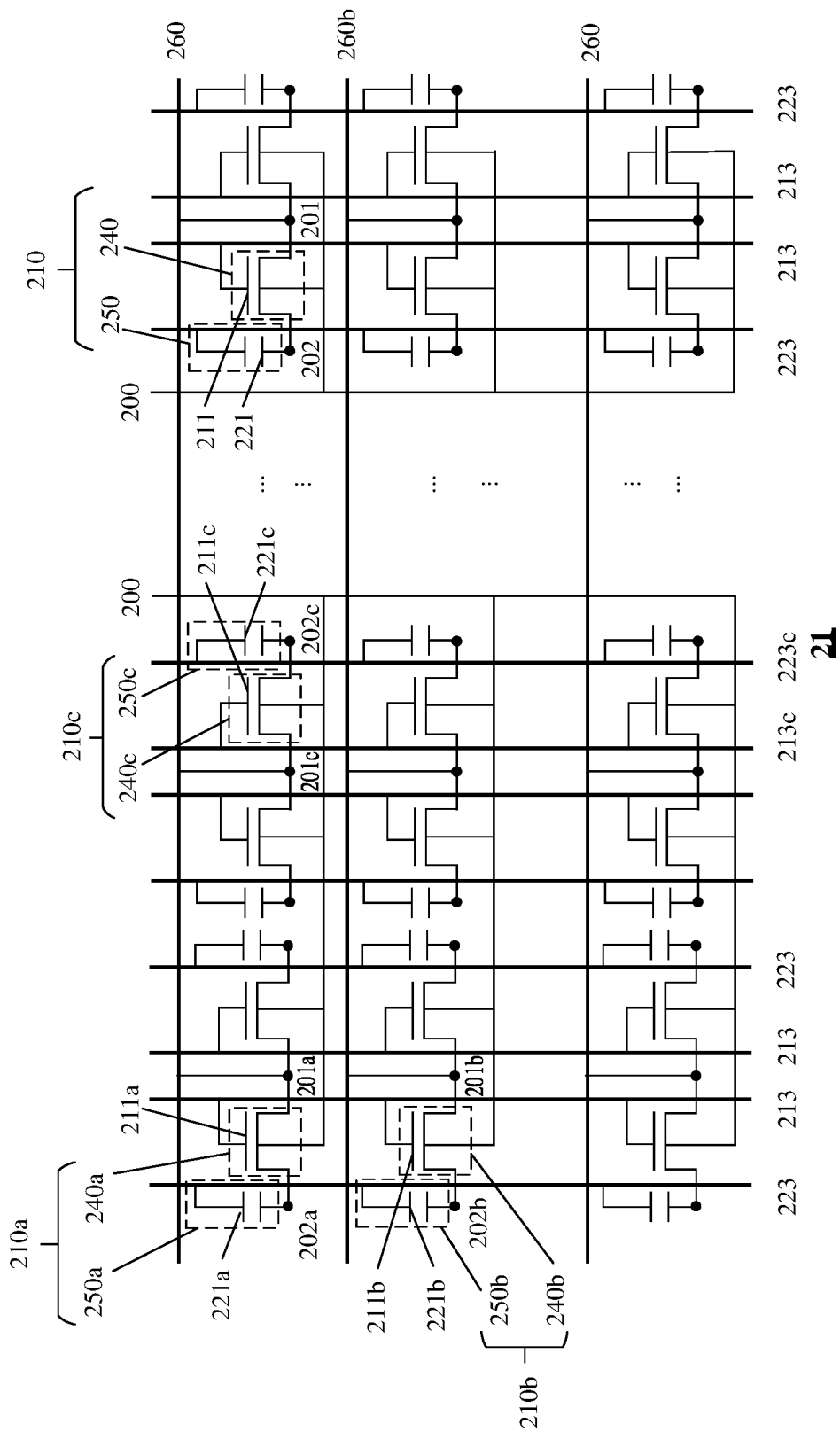
FIG. 8 illustrates a schematic structural diagram of a memory array in a memory according to embodiments of the disclosure.

FIG. 8 illustrates a schematic structural diagram of a memory array 21. A selection transistor 240 and an antifuse bit structure 250 form a memory cell 210. Each word line 213 is connected with first gate electrodes 211 of multiple memory cells in the extension direction of the word line. Each third metal line 223 is connected with second gate structures 221 of multiple memory cells 210 in the extension direction of the third metal line. A first metal line 260 (bit line) is connected with two memory cells 210 that are adjacent to each other and share a first doped area 201. The memory array 21 further includes a substrate 200 that to which a voltage can be applied, thereby simultaneously applying voltage to the channels of the selection transistors 240 in multiple memory cells 210 to ensure that the PN junctions in multiple selection transistors 240 are not reversely broken down.

As illustrated in FIG. 9, the embodiments of the disclosure further provide a method for operating a memory, the memory including the semiconductor structure of any above embodiment; and the method includes the following operation S10.

S10, according to data to be written in, write-in operation is carried out on the memory. The write-in operation includes: a target antifuse bit structure among antifuse bit structures of the memory is broken down, to switch the target antifuse bit structure into a breakdown state from a non-breakdown state; and a non-target antifuse bit structure is kept in the non-breakdown state. The non-target antifuse bit structure is an antifuse bit structure other than the target antifuse bit structure.

In embodiments of the disclosure, referring to FIG. 8, when a write-in operation is performed on a target memory cell 210a, a second gate dielectric layer of a target antifuse bit structure 250a in a memory array 21 is broken down according to data to be written, so that the target antifuse bit structure 250a is switched into a breakdown state from a non-breakdown state. Meanwhile, the non-target antifuse bit structures 250b and 250c is kept in the non-breakdown state. It can be understood that different voltages are applied to the second doped area and the second gate electrode, so that the voltage difference between the second doped area and the second gate electrode is greater than or equal to the breakdown voltage HV, and the breakdown of the antifuse bit structure is realized; and if the voltage difference between the two is smaller than the breakdown voltage HV, the anti-fuse bit structure can be kept in the non-breakdown state.

In some embodiments, voltages applied to the first metal line and the word line can also be controlled, so that difference between voltage on the first doped area and voltage on the first gate electrode is smaller than breakdown voltage HV of the first gate dielectric layer, and the first gate dielectric layer adopting the thin gate oxide structure is not broken down by mistake. It can be understood that the first gate dielectric layer and the second gate dielectric layer are thin gate oxide structures and have the same thickness, and therefore the breakdown voltages of the first gate dielectric layer and the second gate dielectric layer are both HV. The operation method of the memory 20 will be explained below according to the operation voltage shown in Table 1 and FIG. 8. The non-target memory cell 210b is connected to the same word line 213 and the same third metal line 223 as the target memory cell 210a; and the non-target memory cell 210c is connected to the same bit line, i.e., the first metal line 260, as the target memory cell 210a.

TABLE 1

Operation voltage of memory 20

|  | First metal line 260 | WL 213 | Third metal line 223 | Substrate 200 |
|---|---|---|---|---|
| Target memory cell 210a | V3 | V2 | V4 | V1 |
| Non-target memory cell 210b | V1 | V2 | V4 | V1 |
| Non-target memory cell 210c | V3 | Voff | V1 | V1 |

In some embodiments, the write-in operation further includes the following operation. A first voltage is applied to the substrate 200 to keep the non-breakdown state of the selection transistor.

In the embodiments of the disclosure, to prevent a large voltage (such as HV) applied to the first doped area 201 and the second doped area 202 through the first metal line 260 from reversely breaking down the PN junction in the selection transistor 240, a first voltage V1 may be applied to the substrate 200. The first voltage V1 may be HV/2. It can be understood that the first voltage V1 may be applied simultaneously to the substrates of the selection transistors 240 in multiple memory cells 210 to simplify the operation of the memory 20.

In some embodiments, the operation that the target antifuse bit structure 250a among the antifuse bit structures 250 of the memory is broken down, to switch the target antifuse bit structure 250a into the breakdown state from the non-breakdown state includes the following operations:

A second voltage V2 is applied to a first gate electrode 211a of a selection transistor 240a connected with the target antifuse bit structure 250a so as to switch on the selection transistor 240a connected with the target antifuse bit structure. A third voltage V3 is applied to a first metal line 260 connected with the selection transistor 240a connected with the target antifuse bit structure. A difference between the third voltage V3 and the second voltage V2 is smaller than a breakdown voltage HV of the first gate dielectric layer.

A fourth voltage V4 is applied to a second gate electrode 221a of the target antifuse bit structure 250a to switch the target antifuse bit structure 250a into the breakdown state from the non-breakdown state. A voltage difference between the third voltage V3 and the fourth voltage V4 is greater than or equal to a breakdown voltage HV of the second gate dielectric layer.

In the embodiments of the disclosure, write-in of data may be realized by breakdown of the target antifuse bit structure 250a in the target memory cell 210a. Specifically, as illustrated in FIG. 8, the second voltage V2 is applied to a first gate electrode 211a of the selection transistor 240a connected with the target antifuse bit structure 250a, namely, the second voltage V12 is applied to the WL 231 so as to switch on the selection transistor 240a. Optionally, the second voltage V2 here may be a breakdown voltage HV. At the same time, a third voltage V3 is applied to the first metal line 260 connected with the selection transistor 240a, and a fourth voltage V4 is applied to the second gate electrode 221a of the target antifuse bit structure 250a, namely, a fourth voltage V4 is applied to the third metal line 223. Thus, the third voltage V3 is applied to the second doped area 202a of the target antifuse bit structure 250a by the conducted selection transistor 240a, and the voltage difference between the third voltage V3 and the fourth voltage V4 is greater than or equal to the breakdown voltage HV, so that the target antifuse bit structure 250a is switched into the breakdown state from the non-breakdown state. Optionally, the third voltage V3 here may be the breakdown voltage HV, and the fourth voltage V4 may be 0 V. It can be understood that since the second voltage V2 is applied to the first gate electrode 211a and the third voltage V3 is applied to the first doped area 201a, the voltage difference between the first gate electrode 211a and the first doped area 201a is 0V, which is smaller than the breakdown voltage HV of the first gate dielectric layer, thereby ensuring that the first gate dielectric layer is not broken down by mistake.

In some embodiments, the operation that the non-target antifuse bit structures is kept in the non-breakdown state includes the following operations:

A second voltage V2 is applied to a first gate electrode 211b of a selection transistor 240b connected with the non-target antifuse bit structure 250b so as to switch on the selection transistor 240b connected with the non-target antifuse bit structure 250b; a first voltage V1 is applied to a first metal line 260b connected with the selection transistor 240b connected with the non-target antifuse bit structure. A difference between the first voltage V1 and the second voltage V2 is smaller than a breakdown voltage HV of the first gate dielectric layer.

A fourth voltage V4 is applied to a second gate electrode 221b of the non-target antifuse bit structure 250b to keep the non-target antifuse bit structure 250b in the non-breakdown state. A voltage difference between the first voltage V1 and the fourth voltage V4 is smaller than a breakdown voltage HV of the second gate dielectric layer.

In the embodiments of the disclosure, the non-target antifuse bit structure 250b in the non-target memory cell 210b also needs to be kept in the non-breakdown state while the target antifuse bit structure 250a in the target memory cell 210a is broken down. Specifically, as illustrated in FIG. 8, for a non-target memory cell 210b connected to the same WL 213 and the same third metal line 223 as the target memory cell 210a, since a second voltage V2 is applied to the first gate electrode 211b of the selection transistor 240b connected to the non-target antifuse bit structure 250b, and the selection transistor 240b is switched, the voltage difference between the second doped area 202b and the second gate electrode 221b of the non-target antifuse bit structure 250b needs to be guaranteed to be smaller than the breakdown voltage HV. Therefore, a first voltage V1 is applied to the first metal line 260b connected with the selection transistor 240b, so that the first voltage V1 is applied to the second doped area 202b of the non-target antifuse bit structure 250b by the conducted selection transistor 240b, and the voltage difference between the fourth voltage V4 on the second gate electrode 221b and the first voltage V1 on the second doped area 202b is smaller than the breakdown voltage HV, so that the non-target antifuse bit structure 250b keeps the non-breakdown state. Optionally, the second voltage here may be HV, the first voltage V1 may be HV/2, and the fourth voltage may be 0V. It can be understood that since the second voltage V2 is applied to the first gate electrode 211b and the first voltage V1 is applied to the first doped area 201b, the voltage difference between the first gate electrode 211b and the first doped area 201b is HV/2, which is smaller than the breakdown voltage HV of the first gate dielectric layer, thereby ensuring that the first gate dielectric layer is not broken down by mistake.

In some embodiments, the operation that the non-target antifuse bit structure is kept in the non-breakdown state includes the following operations:

A cut-off voltage Voff is applied to a first gate electrode 211c of a selection transistor 240c connected with the non-target antifuse bit structure 250c so as to cut off the selection transistor 240c connected with the non-target antifuse bit structure 250c. A third voltage V3 is applied to a first metal line 260 connected with the selection transistor 240c connected with the non-target antifuse bit structure 250c. A difference between the third voltage V3 and the cut-off voltage Voff is smaller than a breakdown voltage of the first gate dielectric layer.

A first voltage V1 is applied to a second gate electrode 221c of the non-target antifuse bit structure 250c to keep the non-target antifuse bit structure 250c in the non-breakdown state. A voltage difference between the third voltage V3 and the first voltage V1 is smaller than a breakdown voltage of the second gate dielectric layer.

In the embodiments of the disclosure, the non-target antifuse bit structure 250c in the non-target memory cell 210c also needs to be kept in the non-breakdown state while the target antifuse bit structure 250a in the target memory cell 210a is broken down. Specifically, as illustrated in FIG. 8, the non-target memory cell 210c is connected to the same first metal line 260, i.e., bit line, as the target memory cell 210a. Since the third voltage V3 is applied to the first metal line 260 connected with the non-target antifuse bit structure 250c, a cut-off voltage Voff can be applied to the first gate electrode 211c of the selection transistor 240c connected with the non-target antifuse bit structure 250c, namely, the cut-off voltage Voff can be applied to the word line 213c to cut off the selection transistor 240c. In such as a case, the third voltage V3 cannot be transmitted to the second doped area through the selection transistor 240c. At the same time, a first voltage V1 may also be applied to a second gate electrode 221c of the non-target antifuse bit structure 250c, namely, the first voltage V1 is applied to the third metal line 223c; meanwhile, the difference between the third voltage V3 and the first voltage V1 is smaller than the breakdown voltage HV of the second gate dielectric layer, so that it is further ensured that the non-target antifuse bit structure 250c is not broken down. Optionally, the cut-off voltage Voff here may be HV/2, the first voltage V1 may be HV/2, and the third voltage may be the breakdown voltage HV. It can be understood that since the cut-off voltage Voff is applied to the first gate electrode 211c and the third voltage V3 is applied to the first doped area 201c, the voltage difference between the first gate electrode 211c and the first doped area 201c is HV/2, which is smaller than the breakdown voltage HV of the first gate dielectric layer, thereby ensuring that the first gate dielectric layer is not broken down by mistake.

In some embodiments, the method further includes: a read operation is carried out on the memory. The read operation includes: the substrate 200 is grounded; a first read voltage Vwlr is applied to a first gate electrode 211 of a selection transistor 240 connected with one of the antifuse bit structures 250 so as to switch on the selection transistor 240 connected with the one of the antifuse bit structures; a second readd voltage Vblr is applied to a first metal line 260 connected to the selection transistor 240 connected with the one of the antifuse bit structures; and a current on the first metal line 260 is detected.

TABLE 2

| | Operation voltage of memory 20 | | | | | | |
|---|---|---|---|---|---|---|---|
| | Object | | | | | | |
| | Third metal line 223 | | WL 213 | | First metal line 260 | | Substrate 200 |
| | Type | | | | | | |
| | Target memory cell | Non-target memory cell | Target memory cell | Non-target memory cell | Target memory cell | Non-target memory cell | None |
| Write-in | 0 V | HV/2 | HV | HV/2 | HV | HV/2 | HV/2 |
| Read | 0 V | 0 V | Vwlr | 0 V | Vblr | 0 V | 0 V |

In the embodiments of the disclosure, write-in and read operations may also be performed on the memory 20 according to the operation voltages as shown in Table 2. Vblr is the second read voltage Vblr of the first metal line 260, i.e., bit line; and Vvwlr is the first read voltage Vwlr of the WL 213. When Vwlr is applied to the word line 213, i.e., the first gate electrode 211, the selection transistor 240 is switched on; in such a case, the substrate 200 is grounded, i.e., the voltage on the substrate 200 is 0 V, Vblr is applied to the first metal line 260, and 0 V is applied to the third metal line 223, i.e., the second gate electrode 221c. Thus, by detecting the current on the first metal line 260, whether the antifuse bit structure 250 is in a breakdown state or a non-breakdown state can be determined, thereby implementing the read operation.

In some embodiments, the voltage required for breakdown is small due to the small overlapped area between the second doped area and the antifuse electrode. Therefore, a relatively small voltage can be applied to the substrate, the word line structure, the antifuse electrode and the first metal line in the memory, and the duration of the applied voltage is relatively short, so that the purpose of saving energy consumption is achieved.

It is to be noted that the characteristics disclosed in some method or device embodiments provided in the disclosure can be freely combined without conflicts to obtain new method embodiments or device embodiments. The above is only detailed description of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the disclosure shall be subjected to the scope of protection of the claims.

INDUSTRIAL APPLICABILITY

In the semiconductor structure provided by the embodiments of the disclosure, the first gate structure and the second gate structure have the same thickness smaller than a preset thickness; and an orthographic projection of the second gate structure on the substrate is at least partially overlapped with the second doped area. Therefore, on one hand, the first gate structure and the second gate structure can have thin gate oxide structures with the same thickness, so that the channel width of the selection transistor is smaller, which reduces the occupied area of the semiconductor structure; meanwhile, the thin gate oxide structures of the first gate structure and the second gate structure can be synchronously formed, so that the manufacturing process is simplified. On the other hand, the length of the antifuse bit structure in the horizontal direction is reduced by the overlapped part between the second gate structure and the second doped area, which also reduces the occupied area of the semiconductor structure, and the integration level of the memory is improved.

The invention claimed is:
1. A semiconductor structure, comprising:
a substrate;
a first gate structure and a second gate structure that are located on a surface of the substrate and have a same thickness; and
a first doped area and a second doped area that are located in the substrate and are located on two sides of the first gate structure respectively, wherein the first gate structure forms a selection transistor with the first doped area and the second doped area;
an orthographic projection of the second gate structure on the substrate is at least partially overlapped with the second doped area; the second gate structure and the second doped area form an antifuse bit structure; and a breakdown state and a non-breakdown state of the antifuse bit structure are configured to represent different stored data respectively;
a first metal line wherein the first metal line is located above the first gate structure and the second gate structure, and is connected with the first doped area through a first connection structure; and
a second metal line, wherein the ta line the first gate structure and the first metal line, and is connected with the substrate through a second connection structure.

2. The semiconductor structure of claim 1, wherein the first gate structure comprises a first gate electrode and a first gate dielectric layer located below the first gate electrode; the second gate structure comprises a second gate electrode and a second gate dielectric layer located below the second gate electrode; and
the first gate dielectric layer and the second gate dielectric layer have a same thickness, and are of a thin gate oxide structure.

3. The semiconductor structure of claim 1, further comprising:
an isolating structure, located in the substrate between two adjacent antifuse bit structures, wherein at least a portion of the second connection structure is located above the isolating structure.

4. The semiconductor structure of claim 3, further comprising:
a third doped area, located in the substrate on two sides of the isolating structure, wherein the second connection structure is connected with the substrate through the third doped area.

5. The semiconductor structure of claim 1, further comprising:
a word line located above the first gate structure, wherein the word line is connected with a plurality of first gate structures located in an extension direction of the word line; and
a third metal line located above the second gate structure, wherein an extension direction of the third metal line is parallel to an extension direction of the word line, and the third metal line is connected with a plurality of second gate structures located in the extension direction of the third metal line.

6. The semiconductor structure of claim 1, wherein two adjacent selection transistors are symmetrically disposed and share a same first doped area.

7. A method for operating a memory, the memory comprising the semiconductor structure of claim 1, and the method comprising:
according to data to be written in, carrying out write-in operation on the memory, wherein the write-in operation comprises:
breaking down a target antifuse bit structure among antifuse bit structures of the memory, to switch the target antifuse bit structure into a breakdown state from a non-breakdown state; and
keeping a non-target antifuse bit structure in the non-breakdown state, wherein the non-target antifuse bit structure is an antifuse bit structure other than the target antifuse bit structure.

8. The method of claim 7, wherein the write-in operation further comprises:
applying a first voltage to the substrate to keep the non-breakdown state of the selection transistor.

9. The method of claim 7, wherein the first gate structure comprises a first gate electrode and a first gate dielectric layer located below the first gate electrode; the second gate structure comprises a second gate electrode and a second gate dielectric layer located below the second gate electrode; the semiconductor structure further comprises a first metal line that is located above the first gate structure and the second gate structure, and is connected with the first doped area through a first connection structure; and breaking down the target antifuse bit structure among the antifuse bit structures of the memory to switch the target antifuse bit structure into the breakdown state from the non-breakdown state comprises:
applying a second voltage to a first gate electrode of a selection transistor connected with the target antifuse bit structure so as to switch on the selection transistor connected with the target antifuse bit structure;
applying a third voltage to a first metal line connected with the selection transistor connected with the target antifuse bit structure, wherein a difference between the third voltage and the second voltage is smaller than a breakdown voltage of the first gate dielectric layer; and
applying a fourth voltage to a second gate electrode of the target antifuse bit structure, to switch the target antifuse bit structure into the breakdown state from the non-breakdown state, wherein a voltage difference between the third voltage and the fourth voltage is greater than or equal to a breakdown voltage of the second gate dielectric layer.

10. The method of claim 7, wherein the first gate structure comprises a first gate electrode and a first gate dielectric layer located below the first gate electrode; the second gate structure comprises a second gate electrode and a second gate dielectric layer located below the second gate electrode; the semiconductor structure further comprises a first metal line that is located above the first gate structure and the second gate structure, and is connected with the first doped area through a first connection structure; and keeping the non-target antifuse bit structure in the non-breakdown state comprises:
applying a second voltage to a first gate electrode of a selection transistor connected with the non-target antifuse bit structure so as to switch on the selection transistor connected with the non-target antifuse bit structure;
applying a first voltage to a first metal line connected with the selection transistor connected with the non-target antifuse bit structure, wherein a difference between the first voltage and the second voltage is smaller than a breakdown voltage of the first gate dielectric layer; and
applying a fourth voltage to a second gate electrode of the non-target antifuse bit structure, to keep the non-target antifuse bit structure in the non-breakdown state, wherein a voltage difference between the first voltage and the fourth voltage is smaller than a breakdown voltage of the second gate dielectric layer.

11. The method of claim 7, wherein the first gate structure comprises a first gate electrode and a first gate dielectric layer located below the first gate electrode; the second gate structure comprises a second gate electrode and a second gate dielectric layer located below the second gate electrode; the semiconductor structure further comprises a first metal line that is located above the first gate structure and the second gate structure, and is connected with the first doped area through a first connection structure; and keeping the non-target antifuse bit structure in the non-breakdown state comprises:
applying a cut-off voltage to a first gate electrode of a selection transistor connected with the non-target antifuse bit structure so as to cut off the selection transistor connected with the non-target antifuse bit structure;
applying a third voltage to a first metal line connected with the selection transistor connected with the non-target antifuse bit structure, wherein a difference between the third voltage and the cut-off voltage is smaller than a breakdown voltage of the first gate dielectric layer; and
applying a first voltage to a second gate electrode of the non-target antifuse bit structure, to keep the non-target antifuse bit structure in the non-breakdown state, wherein a voltage difference between the third voltage and the first voltage is smaller a breakdown voltage of the second gate dielectric layer.

12. The method of claim 7, wherein the first gate structure comprises a first gate electrode and a first gate dielectric layer located below the first gate electrode; the semiconductor structure further comprises a first metal line that is located above the first gate structure and the second gate structure, and is connected with the first doped area through a first connection structure; and the method further comprises:
carrying out a read operation on the memory, wherein the read operation comprises:
grounding the substrate;
applying a first read voltage to a first gate electrode of a selection transistor connected with one of the antifuse bit structures so as to switch on the selection transistor connected with the one of the antifuse bit structures;
applying a second read voltage to a first metal line connected with the selection transistor connected with the one of the antifuse bit structures; and
detecting a current on the first metal line.

13. A memory, comprising:
a memory array, the memory array comprising a semiconductor structure; and
a peripheral circuit coupled to the memory array;
wherein the semiconductor structure comprises: a substrate; a first gate structure and a second gate structure that are located on a surface of the substrate and have a same thickness; and a first doped area and a second doped area that are located in the substrate and are located on two sides of the first gate structure respectively, wherein the first gate structure forms a selection transistor with the first doped area and the second doped area; an orthographic projection of the second gate structure on the substrate is at least partially overlapped with the second doped area; the second gate structure and the second doped area form an antifuse bit structure; and a breakdown state and a non-breakdown state of the antifuse bit structure are configured to represent different stored data respectively; and
where the semiconductor structure further comprises:
a first metal line, wherein the first metal line is located above the first gate structure and the second gate structure, and is connected with the first doped area through a first connection structure; and
a second metal line, wherein the second metal line is located between the first gate structure and the first metal line, and is connected with the substrate through a second connection structure.

14. The memory of claim 13, wherein the first gate structure comprises a first gate electrode and a first gate dielectric layer located below the first gate electrode; the second gate structure comprises a second gate electrode and a second gate dielectric layer located below the second gate electrode; and the first gate dielectric layer and the second gate dielectric layer have a same thickness, and are of a thin gate oxide structure.

15. The memory of claim 13, wherein the semiconductor structure further comprises:

an isolating structure, located in the substrate between two adjacent antifuse bit structures, wherein at least a portion of the second connection structure is located above the isolating structure.

16. The memory of claim 15, wherein the semiconductor structure further comprises:

a third doped area, located in the substrate on two sides of the isolating structure, wherein the second connection structure is connected with the substrate through the third doped area.

\* \* \* \* \*

UNITED STATES PATENT AND TRADEMARK OFFICE
CERTIFICATE OF CORRECTION

PATENT NO. : 12,272,641 B2
APPLICATION NO. : 17/951213
DATED : April 8, 2025
INVENTOR(S) : Yanzhe Tang Page 1 of 1

It is certified that error appears in the above-identified patent and that said Letters Patent is hereby corrected as shown below:

In the Claims

Claim 1, Column 16, Lines 14-16, replace "a second metal line, wherein the ta line the first gate structure and the first metal line, and is connected with the substrate through a second connection structure." with --a second metal line, wherein the second metal line is located between the first gate structure and the first metal line, and is connected with the substrate through a second connection structure.--

Signed and Sealed this
Twenty-sixth Day of August, 2025

Coke Morgan Stewart
*Acting Director of the United States Patent and Trademark Office*